(12) United States Patent
Kang

(10) Patent No.: US 6,858,458 B2
(45) Date of Patent: Feb. 22, 2005

(54) CONTACTLESS ACCELERATION SWITCH

(75) Inventor: Joon-Won Kang, Redmond, WA (US)

(73) Assignee: Honeywell International Inc., Morristown, NJ (US)

( * ) Notice: Subject to any disclaimer, the term of this patent is extended or adjusted under 35 U.S.C. 154(b) by 0 days.

(21) Appl. No.: 10/777,002

(22) Filed: Feb. 11, 2004

(65) Prior Publication Data

US 2004/0161869 A1 Aug. 19, 2004

Related U.S. Application Data

(62) Division of application No. 10/040,543, filed on Jan. 7, 2002, now Pat. No. 6,720,634.

(51) Int. Cl.⁷ ............................................... H01L 21/00
(52) U.S. Cl. ........................................... 438/50; 438/52
(58) Field of Search .................................... 438/48–53

(56) References Cited

U.S. PATENT DOCUMENTS

| | | | |
|---|---|---|---|
| 4,873,871 A | 10/1989 | Bai et al. ...................... 73/777 |
| 5,103,279 A | 4/1992 | Gutteridge .................... 357/25 |
| 5,500,549 A | 3/1996 | Takeuchi et al. ............. 257/415 |
| 5,503,017 A | 4/1996 | Mizukoshi ............... 73/514.36 |
| 5,504,356 A | 4/1996 | Takeuchi et al. ............. 257/254 |
| 5,619,050 A | 4/1997 | Uenoyama et al. ......... 257/254 |
| 5,627,397 A | 5/1997 | Kano et al. .................. 257/417 |
| 5,693,545 A | * 12/1997 | Chung et al. .................. 438/49 |
| 5,747,705 A | 5/1998 | Herb et al. ............... 73/862.59 |
| 5,808,210 A | 9/1998 | Herb et al. ............... 73/862.59 |
| 5,808,331 A | * 9/1998 | Zhang et al. ................ 257/254 |
| 5,818,093 A | 10/1998 | Gutteridge et al. .......... 257/417 |
| 5,874,675 A | 2/1999 | Edmans et al. ........... 73/514.21 |
| 5,903,038 A | 5/1999 | Zhang et al. ............... 257/417 |
| 6,388,299 B1 | 5/2002 | Kang et al. .................. 257/415 |

OTHER PUBLICATIONS

Patent Abstracts of Japan, vol. 1999, No. 02, Feb. 26, 1999 & JP 10 303414 A (Fuji Electric Co Ltd), Nov. 13, 1998 abstract; figures.
Lemkin et al., "A 3–Axis Force Balanced Accelerometer Using a Single Proof–Mass" Transducer 1997, Chicago, Illinois, Jun. 16–19, 1997, pp 1185–1188.

* cited by examiner

Primary Examiner—H. Jey Tsai
(74) Attorney, Agent, or Firm—McDonnell Boehnen Hulbert & Berghoff LLP

(57) ABSTRACT

A contactless acceleration switch detects a threshold acceleration value when a mass attached to a spring, moves towards a source, a drain, and a threshold adjustment channel implanted in a substrate layer. The threshold adjustment channel is located between the source and the drain. The implanted area is located between insulator posts. A spring is attached to the insulator posts. A mass is held above the implanted area by the spring. When the threshold acceleration value is detected, the mass moves towards the substrate layer. The threshold adjustment channel then inverts causing current to flow between the source and the drain, providing an electrical signal indicating that the threshold acceleration value has been reached.

30 Claims, 4 Drawing Sheets

CONTACTLESS ACCELERATION SWITCH

FIELD

The present invention relates generally to acceleration switches, and more particularly, relates to a semiconductor acceleration switch without metal contacts.

BACKGROUND

Acceleration switches are designed to switch on or off when a threshold acceleration value of acceleration is detected. An example of an application using acceleration switches is air bag systems. The acceleration switch in an airbag system will detect a sudden de-acceleration of the vehicle. When the threshold acceleration value is reached, the contacts on the switch close, sending a signal to the control module. Acceleration switches are also used in free fall detection systems for elevators, seat belt sensors, and machine monitoring of excess vibrations.

Acceleration switches were initially mechanical switches that included a spring loaded mass. Today, acceleration switches are more commonly manufactured using micromachining. Micromachining typically involves combining electronics and tiny mechanical components on a semiconductor chip. Initial designs used bulk micromachining, which consists of making micromechanical devices by etching into the silicon wafer. Bulk micromachining makes extensive use of wafer bonding, which is the process of permanently joining different silicon wafers together.

Further improvements in the manufacture of acceleration switches have been made using surface micromachining. Surface micromachining fabricates micromechanical devices on the surface of a silicon wafer. The features of the device are built up layer by layer through a combination of deposition, patterning, and etching stages. This technique is compatible with other semiconductor processing that may be performed on the same wafer for other purposes. Results from surface micromachining may be more uniform and more repeatable than those obtained from bulk micromachining.

Typical acceleration switches have contained at least one electrical contact. The contacts are designed to close when the threshold acceleration value is detected. The contacts are formed with a metal, such as gold. However, there may be problems with the use of metal contacts, such as microwelding, arcing, and oxidation. These problems may contribute to the failure of the switch.

It would be desirable to have an acceleration switch that does not employ a metal contact to signal when the threshold acceleration value is detected.

SUMMARY

In accordance with this invention, a contactless acceleration switch contains a substrate layer containing a source, a drain, a threshold adjustment channel, at least two insulator posts, a mass, a spring, and a gate insulating layer. The source, the drain, the threshold adjustment channel, and the gate insulating layer are located between the at least two insulator posts. The spring is attached to each of the at least two insulator posts and supports the mass, above the substrate layer.

The contactless acceleration switch is made as follows. Implant the source, the drain, and the threshold adjustment channel in the substrate layer such that the threshold adjustment channel is located between the source and the drain. Form the at least two insulator posts on the substrate layer such that the source, the drain, and the threshold adjustment channel are located between the at least two insulator posts. Form a first sacrificial layer on the substrate layer between the at least two insulator posts. Form the mass on the first sacrificial layer. Form a second sacrificial layer shaped to provide a pattern for forming the spring. Form the spring. Remove the first sacrificial layer and the second sacrificial layer. Form the gate insulating layer.

BRIEF DESCRIPTION OF THE DRAWINGS

Preferred embodiments are described below in conjunction with the appended drawing figures, wherein like reference numerals refer to like elements in the various figures, and wherein.

DETAILED DESCRIPTION

Figure 1:
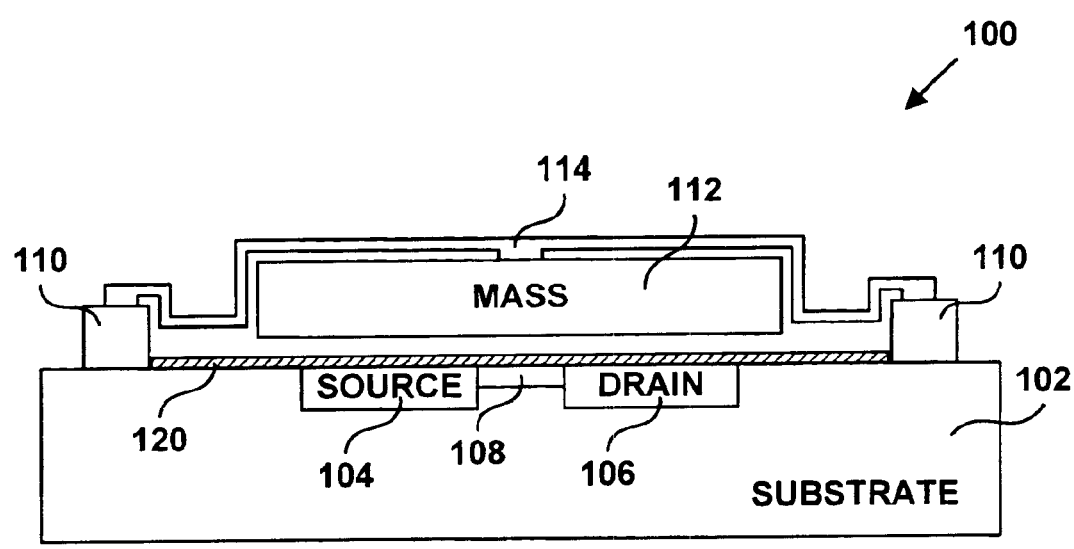
FIG. 1 is a cross-sectional view of a contactless acceleration switch according to an exemplary embodiment.

FIG. 1 is a cross sectional view of a contactless acceleration switch 100 according to an exemplary embodiment. The figures are not drawn to scale and are approximations of an exemplary embodiment. For example, corners may be rounded in an exemplary embodiment, rather than straight as depicted. Contactless acceleration switch 100 includes a substrate layer 102, a source 104, a drain 106, a threshold adjustment channel 108, at least two insulator posts 110, a mass 112, a spring 114, and a gate insulating layer 120.

The substrate layer 102 is the underlying material upon which the contactless acceleration switch 100 is fabricated. The substrate layer 102 may be composed of a semiconductor material such as silicon or gallium arsenide. Silicon is the preferred material for the substrate layer 102 in an exemplary embodiment. The substrate layer 102 may be doped with either a P-type or N-type dopant.

The source 104 and the drain 106 may be substantially located in the substrate layer 102. The source 104 and the drain 106 may be doped based on whether the substrate layer 102 has been doped. Typically the source 104 and the drain 106 are doped with the opposite dopant type as the substrate layer 102. For example, if the substrate layer 102 has been doped with a P-type dopant, the source 104 and the drain 106 may be doped with an N-type dopant. Ion implantation may be employed to dope the source 104 and the drain 106; however, other methods may be employed.

The threshold adjustment channel 108 may be located between the source 104 and the drain 106, substantially within the substrate layer 102. The threshold adjustment channel 108 may be doped to a level that may cause the threshold adjustment channel 108 to invert when the mass 112 moves substantially towards the substrate layer 102. Ion implantation may be employed to dope the threshold adjustment channel 108; however, other methods may be suitable for this purpose. The threshold adjustment channel 108 may be doped with either P-type or N-type dopant. In an exemplary embodiment, the threshold adjustment channel 108 may be doped with the opposite dopant type as the source 104 and the drain 106. However, some embodiments will use the same dopant type for the threshold adjustment channel 108, the source 104, and the drain 106.

The gate insulating layer 120 may be located substantially above the source 104, the drain 106, and the threshold adjustment channel 108. The gate insulating layer 120 may substantially limit electric conduction between the mass 112 and the substrate layer 102 when the mass 112 moves substantially towards the substrate layer 102. The gate insulating layer 120 may be composed of an insulating material, such as silicon dioxide or silicon nitride. Silicon dioxide is the preferred material for the gate insulating layer 120 in an exemplary embodiment.

The at least two insulator posts 110 may be composed of an insulating material, such as silicon dioxide or silicon nitride. In an exemplary embodiment, the at least two insulator posts 110 are composed of silicon dioxide. The at least two insulator posts may be substantially located on the substrate layer 102. The source 104, the drain 106, the threshold adjustment channel 108, and the gate insulating layer 120 may be substantially located between the at least two insulator posts 110. The at least two insulator posts may provide an interface between the substrate layer 102 and the spring 114.

The mass 112 may be formed with an electrically conductive material, such as metal or doped silicon. In an exemplary embodiment, the mass 112 is composed of doped silicon. The mass 112 may operate as a moveable gate in combination with the source 104, and the drain 106, forming a field effect transistor (FET). The mass 112 may be located substantially above the source 104, the drain 106, the threshold adjustment channel 108, and the gate insulating layer 120.

A substantially constant voltage may be applied between the mass 112 and the substrate layer 102. The voltage may be determined using factors such as mass size, spring constant, operation range, and hysteresis. The voltage may range from less than five volts for low acceleration range devices to hundreds of volts for large acceleration range devices. The voltage amount may also provide a method of adjusting a threshold acceleration value. The threshold acceleration value may be the value of acceleration at which the contactless acceleration switch 100 may be triggered.

An air gap may be located between the mass 112 and the gate insulating layer 120 when an acceleration level is below the threshold acceleration value. The thickness of the air gap may be dependant upon the value of the substantially constant voltage applied between the mass 112 and the substrate 102, and the threshold acceleration value. The air gap thickness for a low range value of acceleration that may trigger the contactless acceleration switch 100 may be greater than 1000 Angstroms.

The spring 114 may be formed with an electrically conductive material, such as metal or doped silicon. In an exemplary embodiment, the spring 114 is composed of doped silicon. The spring 114 may be attached to each of the at least two insulator posts 110. The mass 112 may be attached to substantially the center of the spring 114.

Below the threshold acceleration value, the mass 112 may not be attracted to the substrate layer 102 and the threshold adjustment channel 108 may not be inverted. When the acceleration level exceeds the threshold acceleration value, an electric field between the mass 112 and the substrate layer 102 may form. The electric field may create an electrostatic force, which may attract the mass 112 to the substrate layer 102. The mass 112 may move towards the substrate layer 102 to a position of critical distance. The position of critical distance may be the distance between the mass 112 and the substrate layer 102 at which point the electrostatic force exceeds a spring force. The spring force may be a force of the spring 114 that operates to maintain the air gap between the mass 112 and the substrate layer 102.

Once the mass 112 reaches the position of critical distance, the mass 112 may suddenly contact the gate insulating layer 120, eliminating the air gap. In other words, some or all of the mass 112 may contact at least a portion of the gate insulating layer 120. When the mass 112 substantially contacts the gate insulating layer 120, the strength of the electric field may be at a maximum level. The threshold adjustment channel 108 may invert, allowing current to flow between the source 104 and the drain 106, which may turn on the FET. The threshold acceleration value may be determined by the initial air gap thickness, the position of critical distance, the spring strength, and the value of the substantially constant voltage applied between the mass 112 and the substrate layer 102.

The source 104 and the drain 106 may act as electrodes, providing an electrical signal indicating that the threshold acceleration value has been reached. The electrical signal may be sent to a controller for further processing. The electrical signal may be a value of voltage, current, or resistance. As described, the contactless acceleration switch 100 may substantially provide on-off switching without the need for metal contacts.

Figure 2:
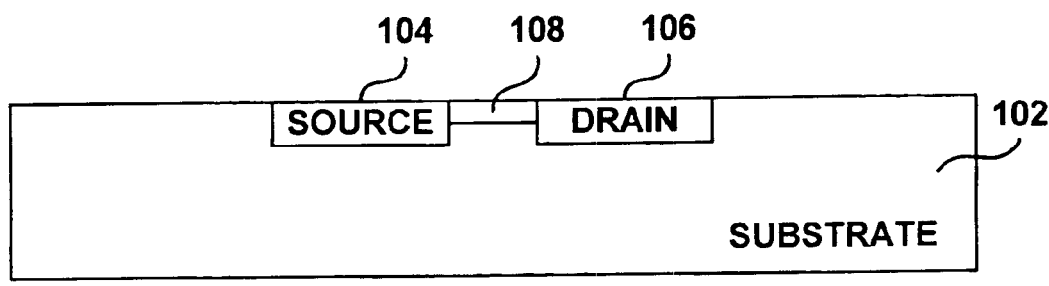
FIGS. 2–5 are cross-sectional views of the contactless acceleration switch of FIG. 1 at various stages of fabrication according to an exemplary embodiment.

FIG. 2 is a cross sectional view of the contactless acceleration switch 100 during the initial steps of processing according to an exemplary embodiment. The contactless acceleration switch 100 may be fabricated using surface micromachining technology. Manufacturing of the contactless acceleration switch 100 may begin by performing the source 104, drain 106, and threshold adjustment channel 108 implants. Ion implantation may be used to dope the source 104, the drain 106, and the threshold adjustment channel 108 regions in the substrate layer 102. Other doping methods that are compatible with the substrate layer 102 may also be used. As previously discussed, the substrate layer 102, the source 104, the drain 106, and the threshold adjustment channel 108 may be doped with either P-type or N-type dopant. In an exemplary embodiment, the substrate layer 102 and the threshold adjustment channel 108 are doped with the opposite dopant type as the source 104 and the drain 106. However, other embodiments may use a different selection of dopant types.

Figure 3:
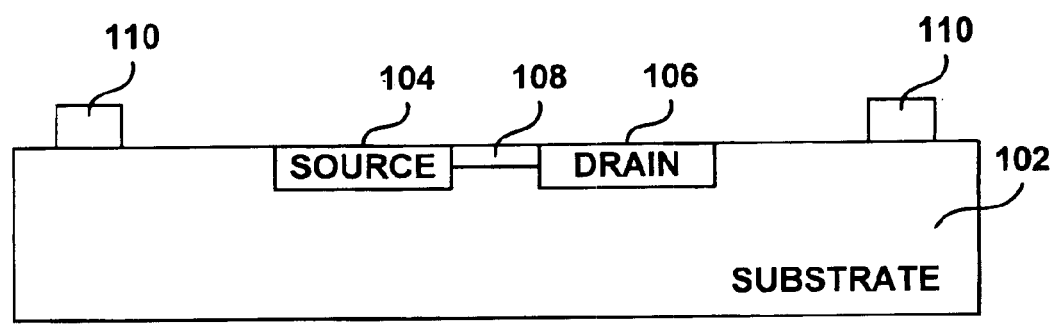

FIG. 3 is a cross sectional view of the contactless acceleration switch 100 during additional stages of processing according to an exemplary embodiment. The at least two insulator posts 110 are installed. An insulating material, such as silicon dioxide or silicon nitride, may be deposited on the substrate layer 102. In an exemplary embodiment silicon dioxide is used. The at least two insulator posts 110 are thermally grown in an exemplary embodiment. However, the at least two insulator posts 110 may also be deposited using low temperature oxidation, low pressure chemical vapor deposition, sputtering, or other deposition techniques. A photoresist may be placed on the insulating layer to define the location of the at least two insulator posts 110. In an exemplary embodiment, the at least two insulator posts 110 are then formed using a wet etch technique. Other etching techniques, such as plasma etching, may also be suitable. The photoresist may then be removed.

Figure 4:
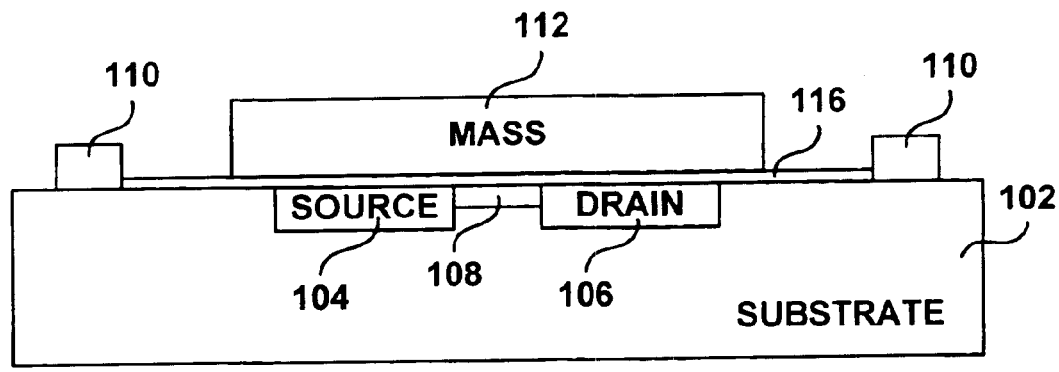

FIG. 4 is a cross sectional view of the contactless acceleration switch 100 during additional stages of processing according to an exemplary embodiment. After the at least two insulator posts 110 are formed, a first sacrificial layer 116 may be deposited. The first sacrificial layer 116 may be composed of silicon dioxide, polymide, photoresist, various polymers, doped silicon, or metals. The selection of the first sacrificial layer material may depend upon the material selected for the mass 112 and the spring 114, and which etching technique may be employed. In an exemplary embodiment, the first sacrificial layer 116 is composed of silicon dioxide.

The first sacrificial layer 116 may be deposited substantially between the at least two insulator posts 110. The deposition method selected may be chosen based on the material used for the first sacrificial layer 116. In an exemplary embodiment, the first sacrificial layer 116 is thermally grown. The first sacrificial layer 116 may also be deposited using low temperature oxidation, low pressure chemical vapor deposition, sputtering, or other deposition techniques. The first sacrificial layer 116 is then patterned and etched to form a substantially continuous layer between the at least two insulator posts 110. A wet etch is preferred in an exemplary embodiment; however, other etching techniques, such as plasma etching, may also be suitable for this purpose.

The mass 112, which operates as a moveable gate, may then be deposited on the first sacrificial layer 116 using a low pressure chemical vapor deposition process. Other deposition methods, such as sputtering, may also be used. The mass 112 is then patterned and etched. A plasma etch is employed in an exemplary embodiment; however, other etching methods may also be suitable for this purpose.

Figure 5:
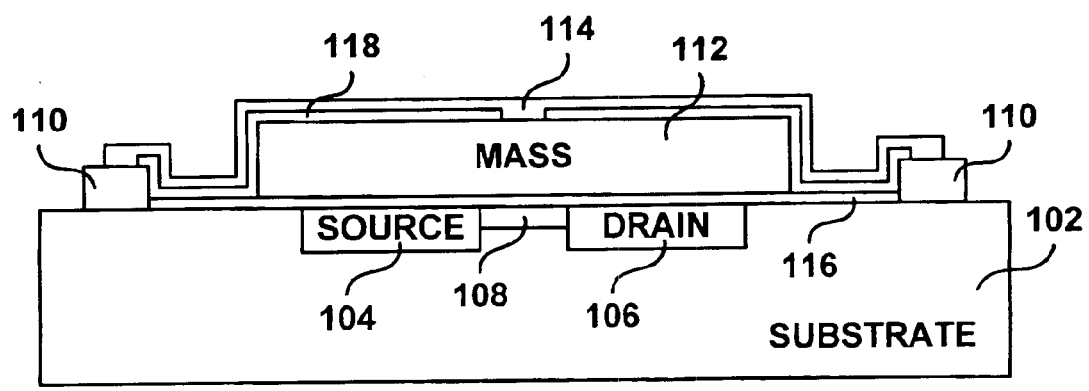

FIG. 5 is a cross sectional view of the contactless acceleration switch 100 during additional stages of processing according to an exemplary embodiment. A second sacrificial layer 118 may then be deposited. The second sacrificial layer 118 may be composed of silicon dioxide, polymide, photoresist, various polymers, doped silicon, or metals. The selection of the second sacrificial layer material may depend upon the material selected for the mass 112 and the spring 114, and which etching technique may be employed. In an exemplary embodiment, the second sacrificial layer 118 is composed of silicon dioxide.

The deposition method employed may be chosen based on the material selected for the second sacrificial layer 118. In an exemplary embodiment, low temperature oxidation is employed. However, other deposition techniques, such as tetraetheyl orthosilicate, low pressure chemical vapor deposition, sputtering, or other deposition techniques, may also be suitable for this purpose. The second sacrificial layer 118 is then patterned to provide interconnection between the mass 112 and the at least two insulator posts 110. An etching process is then employed to form the second sacrificial layer 118. In an exemplary embodiment a wet etch is used; however, other etching techniques, such as plasma etching, may be employed. The shape of the second sacrificial layer may be designed to provide a pattern for forming the spring 114.

The spring material is then deposited substantially on the second sacrificial layer 118 and the at least two insulator posts 110. The deposition process employed may be chosen to be compatible with the spring material chosen. Low pressure chemical vapor deposition may be used in an exemplary embodiment; however, other deposition techniques, such as sputtering, may also be suitable for this purpose. The spring material may then be patterned and etched to substantially form the spring 114. An exemplary embodiment employs a plasma etch. Other etching techniques, such as a wet etch, may also be suitable for this purpose.

The first sacrificial layer 116 and the second sacrificial layer 118 may then be substantially removed, leaving the spring 114 and the mass 112 as a free standing structure (see FIG. 1). The first sacrificial layer 116 and the second sacrificial layer 118 may be removed by etching. Any etching process that is selective to the material of the sacrificial layers may be used. A wet etch may be used in an exemplary embodiment to remove the first sacrificial layer 116 and the second sacrificial layer 118. An air gap may be located substantially between the mass 112 and the substrate layer 102 after the first sacrificial layer 116 is removed.

The gate insulating layer 120 may be deposited on the substrate layer 102, substantially above the source 104, the drain 106, and the threshold adjustment channel 108. In a preferred embodiment, silicon dioxide may be thermally grown on the substrate layer 102 between the two insulator posts 110 after the first sacrificial layer 116 is removed. In an alternative embodiment, the gate insulating layer 120 may be deposited before the deposition of the first sacrificial layer 116. When the first sacrificial layer 116 is removed, the gate insulating layer 120 may be uncovered. This alternative embodiment may be employed when etching the first sacrificial layer 116 will not damage the underlying gate insulating layer 120. For example, if the first sacrificial layer materials are metal, an etch may be chosen that may remove the first sacrificial layer 116 without damaging the gate insulating layer 120.

Figure 6:
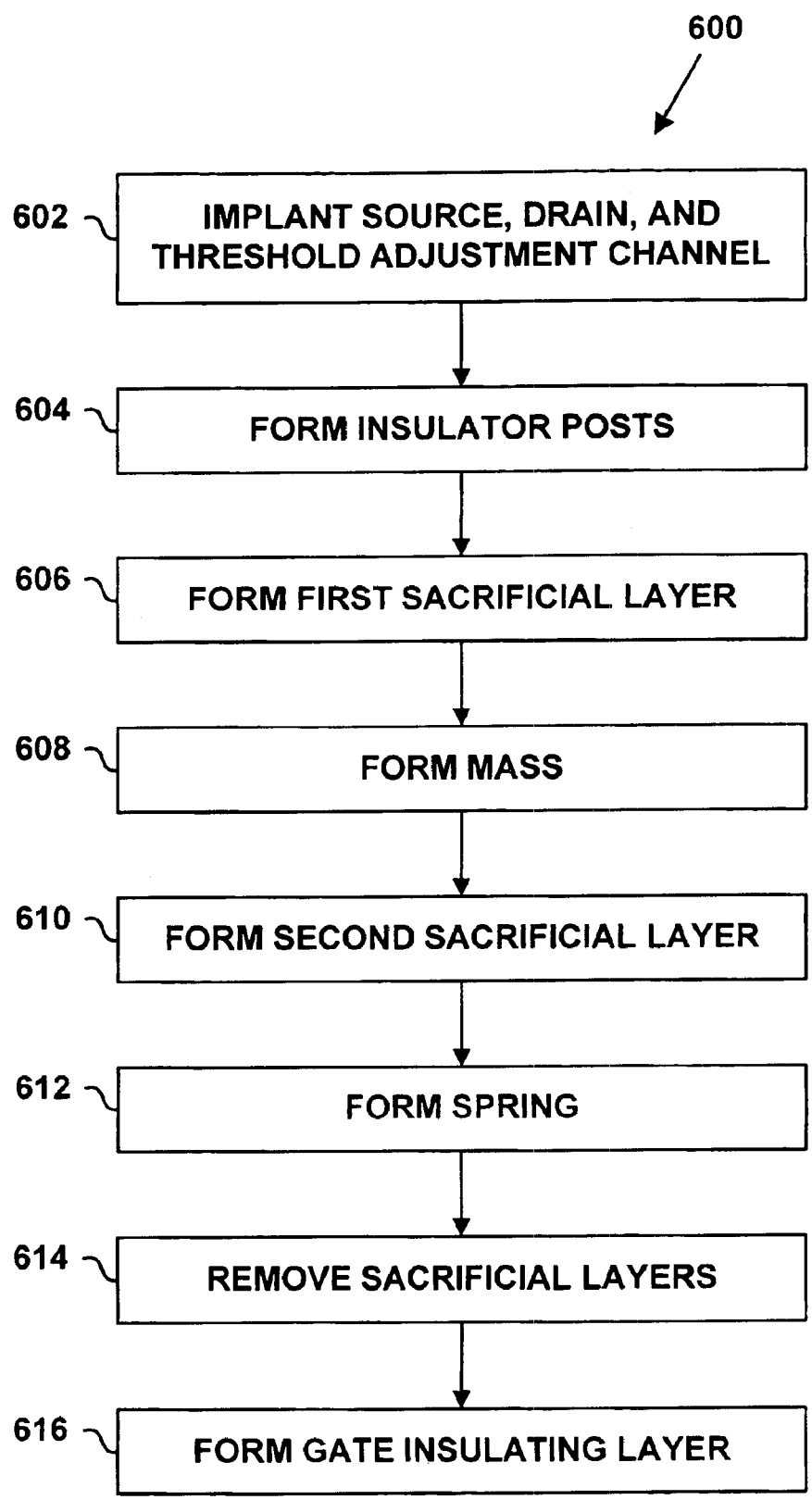
FIG. 6 is a flow chart of the fabrication process of a contactless acceleration switch according to an exemplary embodiment.

FIG. 6 provides a flow chart of fabrication process 600 of the contactless acceleration switch 100 according to an exemplary embodiment. Fabrication process 600 summarizes the process described above with reference to FIG. 2 through FIG. 5. This process may be compatible with complementary metal oxide semiconductor (CMOS) fabrication.

The contactless acceleration switch 100 may also be employed in a manner to detect when the acceleration level goes below the threshold acceleration value. The mass 112 may move away from the substrate layer 102 when the acceleration level goes below the threshold acceleration value. The air gap may be formed between the mass 112 and the substrate layer 102. The electrical signal generated may indicate that the acceleration level is below the threshold acceleration value.

It should be understood that the illustrated embodiments are exemplary only, and should not be taken as limiting the scope of the present invention. For example, a variety of semiconductor fabrication techniques, including various methods of deposition and etching, may be employed without departing from the scope of the invention itself. The claims should not be read as limited to the described order or elements unless stated to that effect. Therefore, all embodiments that come within the scope and spirit of the following claims and equivalents thereto are claimed as the invention.

I claim:

1. A method for making a contactless acceleration switch, comprising in combination:
 implanting a source, a drain, and a threshold adjustment channel in a substrate layer, and wherein the threshold adjustment channel is located substantially between the source and the drain;
 forming at least two silicon dioxide insulator posts on the substrate layer, and wherein the source, the drain, and the threshold adjustment channel are located substantially between the at least two insulator posts;
 forming a first sacrificial layer on the substrate layer substantially between the at least two insulator posts;

forming a mass on the first sacrificial layer;

forming a second sacrificial layer shaped to provide a pattern for forming a spring;

forming the spring on the second sacrificial layer;

removing the first sacrificial layer and the second sacrificial layer, wherein the at least two insulator posts provide an interface between the substrate layer and the spring, and wherein the spring holds the mass substantially above the substrate layer; and forming a gate insulating layer.

2. The method of claim 1, wherein the substrate layer is composed of a semiconductor material.

3. The method of claim 2, wherein the semiconductor material is silicon.

4. The method of claim 1, wherein ion implantation is used to implant the source, the drain, and the threshold adjustment channel in the substrate layer.

5. The method of claim 1, wherein the threshold adjustment channel is doped to a level to cause the threshold adjustment channel to invert when the mass moves substantially towards the substrate layer.

6. The method of claim 1, wherein the at least two insulator posts are composed of an insulating material.

7. The method of claim 6, wherein the insulating material is silicon dioxide.

8. The method of claim 1, wherein the at least two insulator posts are thermally grown.

9. The method of claim 1, wherein wet etching is used to form the at least two insulator posts.

10. The method of claim 1, wherein the first sacrificial layer is composed of a material selected from the group consisting of silicon dioxide, polymide, photoresist, polymer, doped silicon, and metal.

11. The method of claim 1, wherein the first sacrificial layer is composed of silicon dioxide.

12. The method of claim 1, wherein the first sacrificial layer is thermally grown.

13. The method of claim 1, wherein wet etching is used to form the first sacrificial layer.

14. The method of claim 1, wherein the mass is composed of an electrically conductive material.

15. The method of claim 14, wherein the electrically conductive material is doped silicon.

16. The method of claim 1, wherein the mass is deposited using low pressure chemical vapor deposition.

17. The method of claim 1, wherein plasma etching is used to form the mass.

18. The method of claim 1, wherein the second sacrificial layer is composed of a material selected from the group consisting of silicon dioxide, polymide, photoresist, polymer, doped silicon, and metal.

19. The method of claim 1, wherein the second sacrificial layer is composed of silicon dioxide.

20. The method of claim 1, wherein low temperature oxidation is used to deposit the second sacrificial layer.

21. The method of claim 1, wherein wet etching is used to form the second sacrificial layer.

22. The method of claim 1, wherein the spring is composed of an electrically conductive material.

23. The method of claim 22, wherein the electrically conductive material is doped silicon.

24. The method of claim 1, wherein low pressure chemical vapor deposition is used to deposit the spring.

25. The method of claim 1, wherein plasma etching is used to form the spring.

26. The method of claim 1, wherein wet etching is used to remove the first sacrificial layer and the second sacrificial layer.

27. The method of claim 1, wherein the gate insulating layer is composed of an insulating material.

28. The method of claim 27, wherein the insulating material is silicon dioxide.

29. The method of claim 1, wherein the gate insulating layer is thermally grown.

30. A method for making a contactless acceleration switch, comprising in combination:

implanting a source, a drain, and a threshold adjustment channel in a silicon substrate layer using ion implantation, wherein the threshold adjustment channel is located substantially between the source and the drain, and wherein the threshold adjustment channel is doped to a level to cause the threshold adjustment channel to invert when a mass moves substantially towards the silicon substrate layer;

forming at least two silicon dioxide insulator posts on the silicon substrate layer, wherein the at least two silicon dioxide insulator posts are thermally grown, wherein wet etching is used to form the at least two silicon dioxide insulator posts, and wherein the source, the drain, and the threshold adjustment channel are located substantially between the at least two silicon dioxide insulator posts;

forming a first sacrificial layer composed of silicon dioxide on the silicon substrate layer substantially between the at least two silicon dioxide insulator posts, wherein the first sacrificial layer is thermally grown, and wherein wet etching is used to form the first sacrificial layer;

forming the mass composed of doped silicon on the first sacrificial layer, wherein the mass is deposited using low pressure chemical vapor deposition, and wherein plasma etching is used to form the mass;

forming a second sacrificial layer composed of silicon dioxide shaped to provide a pattern for forming a spring, wherein low temperature oxidation is used to deposit the second sacrificial layer, and wherein wet etching is used to form the second sacrificial layer;

forming the spring composed of doped silicon on the second sacrificial layer, wherein low pressure chemical vapor deposition is used to deposit the spring, and wherein plasma etching is used to form the spring;

removing the first sacrificial layer and the second sacrificial layer using wet etching, wherein the at least two insulator posts provide an interface between the substrate layer and the spring, and wherein the spring holds the mass substantially above the silicon substrate layer; and forming a gate insulating layer composed of silicon dioxide, and wherein the gate insulating layer is thermally grown.

* * * * *